US012812810B2

(12) United States Patent
Schmitz

(10) Patent No.: US 12,812,810 B2
(45) Date of Patent: Nov. 24, 2026

(54) MOTOR VEHICLE ELECTRICAL COMPONENT ASSEMBLY

(71) Applicant: KIEKERT AKTIENGESELLSCHAFT, Heiligenhaus (DE)

(72) Inventor: Andreas Schmitz, Velbert (DE)

(73) Assignee: KIEKERT AKTIENGESELLSCHAFT, Heiligenhaus (DE)

( * ) Notice: Subject to any disclaimer, the term of this patent is extended or adjusted under 35 U.S.C. 154(b) by 212 days.

(21) Appl. No.: 18/842,273

(22) PCT Filed: Feb. 13, 2023

(86) PCT No.: PCT/DE2023/100117
§ 371 (c)(1),
(2) Date: Aug. 28, 2024

(87) PCT Pub. No.: WO2023/186201
PCT Pub. Date: Oct. 5, 2023

(65) Prior Publication Data

US 2025/0185198 A1 Jun. 5, 2025

(30) Foreign Application Priority Data

Mar. 29, 2022 (DE) ..................... 10 2022 107 337.8

(51) Int. Cl.
*B60R 16/03* (2006.01)
*H05K 5/06* (2006.01)

(52) U.S. Cl.
CPC .............. *H05K 5/069* (2013.01); *B60R 16/03* (2013.01)

(58) Field of Classification Search
CPC ........ H05K 5/0052; H05K 5/069; H05K 5/06; B60R 16/03; E05B 77/34; E05B 81/54; E05B 85/02
(Continued)

(56) References Cited

U.S. PATENT DOCUMENTS

2008/0264683 A1 10/2008 Watanabe
2019/0312385 A1* 10/2019 Shain ................. H01R 13/6275
(Continued)

FOREIGN PATENT DOCUMENTS

DE 29513701 U1 9/1996
DE 19914469 C1 6/2000
(Continued)

OTHER PUBLICATIONS

International Search Report mailed May 16, 2023, for priority International Application No. PCT/DE2023/100117.

*Primary Examiner* — Timothy J Thompson
*Assistant Examiner* — Michael F Mcallister
(74) *Attorney, Agent, or Firm* — Renner, Otto, Boisselle & Sklar LLP

(57) ABSTRACT

A motor vehicle electrical component assembly, which is equipped with an electrical component and with a component carrier having conductor tracks for making electrical contact with the component. The component is received in a receptacle in the component carrier without potting compound. According to the invention, a sealing protrusion which seals the receptacle is provided on a cover of the component carrier, and when the cover is united with the component carrier in the assembly direction, said cover sealingly engages by way of the sealing protrusion into the receptacle.

12 Claims, 2 Drawing Sheets

(58) Field of Classification Search
USPC .......................................................... 174/50.5
See application file for complete search history.

(56) References Cited

U.S. PATENT DOCUMENTS

| | | | | |
|---|---|---|---|---|
| 2020/0274292 | A1* | 8/2020 | Goodfellow ....... | H01R 13/6273 |
| 2021/0175660 | A1* | 6/2021 | Bishop .................... | E05B 77/34 |

FOREIGN PATENT DOCUMENTS

| | | | | |
|---|---|---|---|---|
| DE | 10152137 | A1 | | 5/2003 |
| DE | 102012203222 | A1 | | 9/2013 |
| DE | 102012223102 | A1 | | 6/2014 |
| DE | 102014211553 | | * | 12/2015 |
| DE | 102014211553 | A1 | | 12/2015 |
| DE | 102014222428 | A1 | | 5/2016 |
| JP | 2000285759 | A | | 10/2000 |

* cited by examiner

MOTOR VEHICLE ELECTRICAL COMPONENT ASSEMBLY

This application is a national phase of International Patent Application No. PCT/DE2023/100117 filed Feb. 13, 2023, which claims priority to German Patent Application No. 10 2022 107 337.8 filed Mar. 29, 2022, each of which is hereby incorporated herein by reference in its entirety.

FIELD OF DISCLOSURE

The invention relates to a motor vehicle electrical component assembly, having an electrical component, and having a component carrier with conductor tracks for making electrical contact with the component, wherein the component is received in a receptacle in the component carrier without potting compound.

BACKGROUND OF DISCLOSURE

Motor vehicle electrical component assemblies refer to assemblies of components that are used in and on a motor vehicle. As a result, specific requirements for the intended use must be met. These typically include not only covering a wide temperature range of approximately −60° C. to +100° C. without any functional impairment of the components being observed. In addition, such electrical component assemblies usually have to be sealed against moisture and dust in order to ensure functional reliability over long periods of time. For this purpose, so-called component carriers are usually used, on which or with the aid of which the electrical components are positioned and held. For this purpose, the component carriers are equipped with conductor tracks which are used to make electrical contact with the components. In most cases, sealing with potting compound is additionally provided.

The components mentioned here are, by way of example and without limitation, switches or sensors in general as well as electric motors, LEDs, etc. The conductor tracks can be glued to the component carrier (made of plastics material) or embedded in the component carrier.

Typically, such component assemblies are used in conjunction with electric motor drive units that are used to move actuators. These can be window lift drives, spindle drives, seat adjusters, etc. Very particularly preferred are motor vehicle electrical component assemblies that are used in conjunction with motor vehicle closure devices. At this point, the component carrier carries, for example, drives for electrically opening or latching the closure device, as well as one or a plurality of sensors that can be used to query the relevant functional position of the motor vehicle closure device.

The generic state of the art according to DE 10 2014 222 428 A1 is a component carrier switch assembly. An interface between a switch and the component carrier is implemented for this purpose. According to claim 2 therein, it is also possible for the switch not to be potted with the component carrier. For this purpose, a ring seal is provided in connection with the interface in question between the component carrier and the switch.

However, such a ring seal can only be realized and implemented with considerable design effort. This is because the ring seal usually has to be manufactured separately from the component carrier and then unified with it. There is also a risk that the ring seal may be damaged during assembly of the switch and thus may not protect the contacts inside or may not protect them sufficiently. The invention as a whole seeks to remedy this.

SUMMARY OF DISCLOSURE

The invention is based on the technical problem of further developing such a motor vehicle electrical component assembly in such a way that the design and assembly effort are reduced while dispensing with the use of potting compound.

To solve this technical problem, a generic motor vehicle electrical component assembly is characterized within the scope of the invention in that a sealing protrusion which seals the receptacle is provided on a cover of the component carrier, and when the cover is united with the component carrier in the assembly direction, said cover sealingly engages by way of the sealing protrusion into the receptacle.

The invention is based, first of all, on the finding that the attachment of the component to the component carrier requires the component to be placed in the receptacle of the component carrier. During this process, the component is not only mechanically received in the receptacle. Typically, electrical contact between the component and the one or more conductor tracks is also made at this point. For this purpose, the component in question can be equipped with, for example, plug contacts, solder contacts or clamp contacts, which establish the desired electrical connection with corresponding mating contacts of the associated conductor track. In most cases, an attempt will be made at this point to create a solder-free electrical connection, for example by equipping the switch with plug contacts that are plugged onto or into corresponding mating contacts at the end of the associated conductor track.

To ensure that the free region within the receptacle with the electrical connection established between the component in question and the conductor track, which free region is inevitably present and observed at this point, is protected against corrosion, the current state of the art uses a potting compound to seal the electrical connection established in this region. This is time-consuming and costly.

For this purpose, the generic state of the art according to DE 10 2014 222 428 A1 works with an additionally inserted seal. According to the invention, however, neither the potting compound nor the seal are required. Rather, the free region described above is closed by the sealing protrusion on the cover as soon as the cover is united with the component carrier in the assembly direction.

The invention is based on the further finding that the component carrier together with the one or more components attached thereto and electrically contacted is generally covered by means of an additionally attached cover. For this purpose, the component carrier can, for example, be arranged inside a housing or can itself be a component of the housing. In any case, the attachment of the cover, which is generally a further component of the housing, ensures according to the invention that the receptacle in the region of the electrical connections between the component and the associated conductor track is properly closed off with the aid of the sealing protrusion on the cover. This is because the sealing protrusion sealingly engages into the receptacle in the assembly direction when the cover and the component carrier are united.

In this way, the sealing protrusion as a whole ensures that any free regions remaining within the receptacle enclosing the component are closed off by means of the sealing protrusion. This means that the additional application of potting compound and the upstream assembly of a seal are no longer necessary, such that advantages are observed in terms of production and assembly. In addition, the cover can generally be removed from the component carrier again, such that the component and in particular its electrical connection or contact region with the associated conductor track can be accessed if necessary and for repair purposes. These are the main advantages.

It is understood that the cover for the component carrier does not necessarily have to cover the entire surface of the component carrier. This means that variants are equally possible within the scope of the invention, for example where the cover only partially covers the component carrier, for example in the region of the component or of the plurality of components. Either way, assembling the cover relative to the component carrier in the assembly direction not only ensures the desired coverage of the component carrier, but also ensures that the receptacle with the component placed therein is closed off by the sealing protrusion.

According to an advantageous embodiment, the sealing protrusion is equipped with at least one sealing lip for sealing. The sealing lip can be molded onto the sealing protrusion. In this case, one embodiment has proven to be particularly advantageous in which the sealing lip is injection-molded onto the sealing protrusion. This is particularly advantageous because the cover and thus the sealing protrusion are usually designed as plastics material molded parts and in particular plastics material injection-molded parts. The sealing lip, which is for example made of an elastomeric plastics material, can therefore be injection-molded directly onto the sealing protrusion in a two-component injection molding process. The component carrier is usually also a plastics material molded part and in particular a plastics material injection-molded part. The relevant conductor track or a conductor track structure can be enclosed by the plastics material, for example by inserting a punched grid into a plastics material injection molding tool for producing the component carrier and overmolding it with the plastics material of the component carrier. In principle, other production methods are of course also conceivable, for example, in which the conductor tracks are glued to the component carrier (also made of plastics material) as a conductor track film.

In order to optimize the sealing effect of the sealing lip provided on the sealing protrusion, the sealing lip can be connected to the sealing protrusion transversely to the assembly direction. However, it is also alternatively or additionally possible for the sealing lip to be connected to the sealing protrusion in the assembly direction. In the first case, the sealing lip therefore has an extension transverse to the assembly direction, while the second case corresponds to the extension of the sealing lip in the assembly direction. Both are also possible.

The sealing protrusion is generally designed as a plug-in pin or at least one plug-in pin. It is also possible to use two or more spaced-apart plug-in pins, which in conjunction with the cover ensure that the receptacle or the remaining free region in the receptacle is sealed. In this context, the plug-in pin or the two or more plug-in pins can be equipped with a sealing formation. The sealing formation can be a flexible region that is provided on the relevant plug-in pin. This flexible region can be defined in a similar way to the sealing lip, for example by injecting elastomeric plastics material.

In another advantageous variant, the plug-in pin and the receptacle are equipped with corresponding bevels. In this way, when the cover is united with the component carrier, the bevel on the plug-in pin automatically slides along the corresponding bevel or counter-bevel of the receptacle, thus ensuring the desired sealing of the receptacle.

The result is a motor vehicle electrical component assembly that has particular advantages in terms of production and assembly. Such advantages are generally observed in all applications of the component assembly in question. Typically, such a component assembly is used in conjunction with an electric motor drive. This electric motor drive can be placed inside a motor vehicle lock housing. In this case, the component carrier may coincide with a wall of the associated housing. It is also conceivable to design the component carrier separately from the housing.

Either way, the component in question can be placed in the receptacle of the component carrier, while at the same time the desired electrical connection to the conductor track or a conductor track structure is established.

The free region observed in this way inside the receptacle is then sealed because the cover that closes the component carrier sealingly engages by way of its sealing protrusion into the receptacle. These are the main advantages.

BRIEF DESCRIPTION OF DRAWINGS

In the following, the invention is explained in more detail with the aid of a drawing showing only an exemplary embodiment; in the figures.

DETAILED DESCRIPTION

Figure 1:
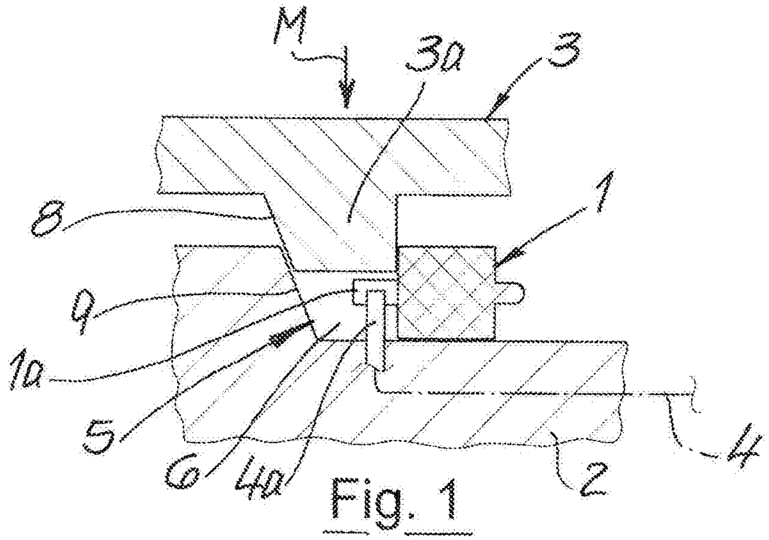
FIG. 1 shows the motor vehicle electrical component assembly according to the invention in a first embodiment variant.

The figures show a motor vehicle electrical component assembly. Within the scope of the exemplary embodiment and not in a limiting manner, the electrical component assembly is an electrical component in the form of an electrical switch 1. Accordingly, the electrical component assembly in question is received as a whole in a housing 2, 3, which may, for example, be a drive housing for receiving an electric motor drive inside. According to the exemplary embodiment, the motor vehicle electrical component assembly with its electrical component or switch 1 is received inside a lock housing 2, 3. The lock housing 2, 3 is a lock housing 2, 3 of a motor vehicle door lock, in which, in addition to the switch 1, a locking mechanism (not shown) and an actuating lever assembly can be received. The switch 1 can be used, for example, to query the position of a rotary latch as part of the locking mechanism.

For this purpose, the electrical component or the switch 1 is held by a component carrier 2 with merely indicated conductor tracks 4 embedded therein for making electrical contact with the component 1 and is mounted inside the housing 2, 3. According to the exemplary embodiment, the component carrier 2 is a component of the lock housing 2, 3, which of course is only an example and not restrictive. In fact, the lock housing 2, 3 in question is composed of, on the one hand, a base or component carrier 2 and, on the other hand, a cover 3 covering and closing the base or component carrier 2.

The switch 1 is not only mounted on the component carrier 2, but is also electrically contacted with the conductor tracks 4. This can be done using a so-called insulation displacement connection, i.e., generally by electrically coupling plug connections 1*a* on the switch 1 with associated mating plug connectors or connecting pieces 4*a* of the conductor tracks 4. For this purpose, the connecting pieces or mating plug connectors 4*a* of the conductor tracks 4 penetrate the component carrier 2 on the surface side, because otherwise the conductor tracks 4 would be embedded in the component carrier 2. In fact, the component carrier 2 is a plastics material injection-molded part in which the conductor tracks 4 are embedded, for example as a stamped part, during the plastics material injection molding process.

For this purpose, the component or the switch 1 is placed in a receptacle 5 which completely or partially encloses the switch 1 and which is indicated in FIG. 1. In this case, the switch 1 or the component usually fills the receptacle 5 in question completely, except for a free region 6, as part of the component carrier 2. In the free region 6, the electrical contact is made between the plug connectors 1*a* of the switch 1 and the connecting pieces or mating plug connectors 4*a* of the conductor tracks 4.

According to the invention, the receptacle 5 or the free region 6 remaining at this point can now be closed by means of a sealing protrusion 3*a* on the cover 3 of the component carrier 2. As soon as the cover 3 is united with the component carrier 2 to form the housing or lock housing 2, 3, the sealing protrusion 3*a* in question on the cover 3 engages directly and sealingly in the receptacle 5 or in the remaining free region 6. The component carrier 2 and the cover 3 are united in the assembly direction M indicated in FIG. 1. FIG. 1 depicts and illustrates this principle. As soon as the cover 3 is mounted, the free region 6 is sealed by the sealing protrusion 3*a*. The receptacle 5 is then also completely closed because the housing of the switch 1 closes the remaining area of the receptacle 5, except for the free region 6.

Figure 2A:
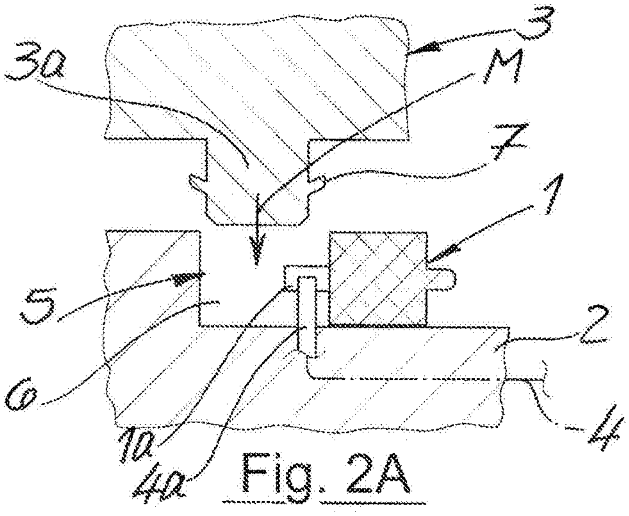
FIGS. 2A and 2B show a further second variant.
Figure 2B:
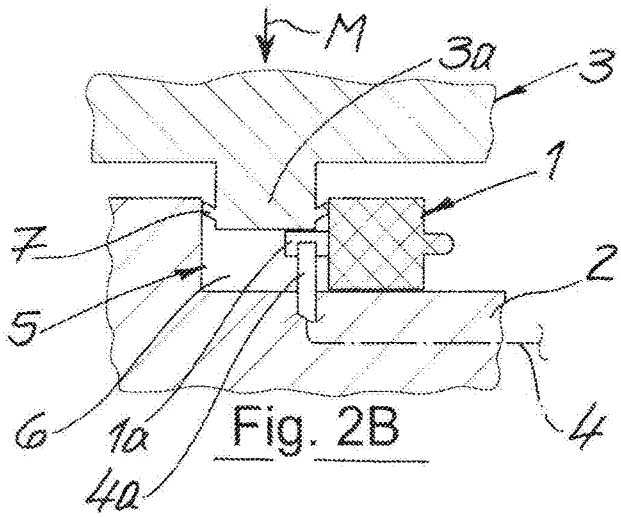

In the variant shown in FIGS. 2A and 2B, it can be seen that the sealing protrusion 3*a* is equipped with a circumferential sealing lip 7, for example, for this purpose. According to the exemplary embodiment, the sealing lip 7 is molded onto the sealing protrusion 3*a*. In fact, one embodiment has proven to be particularly favorable in which the sealing lip 7 is not only made of a flexible, rubber-elastic plastics material. The sealing lip 7 can also be molded onto the cover 3 or the sealing protrusion 3*a* during manufacturing, wherein a so-called two-component plastics material injection molding process is used at this point.

It can be seen that in the variant according to FIGS. 2A and 2B, the flexible sealing lip 7 has an extension that is largely transverse to the assembly direction M. In this way, the sealing lip 7, as shown in the assembled position in FIG. 2B, rests on the one hand against a housing of the switch 1 and on the other hand against the wall of the receptacle 5 of the component carrier 2. In any case, this ensures overall that the receptacle 5 or the free region 6 remaining at this point is tightly sealed.

Figure 4A:
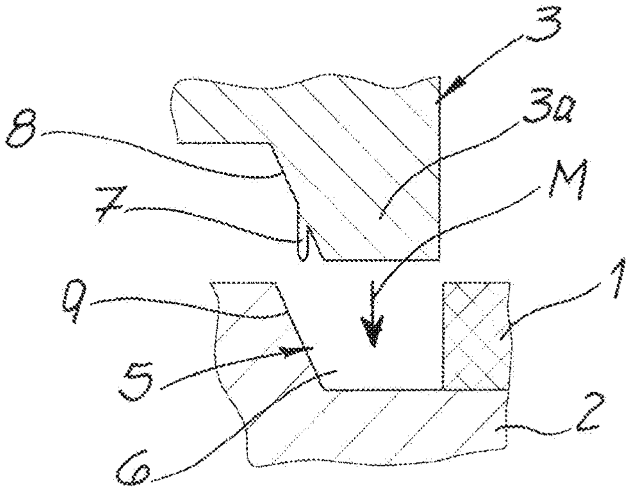
Figure 4B:
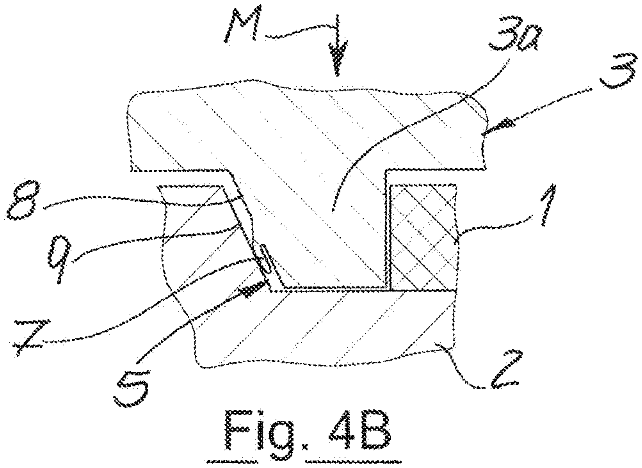

In the further variant according to FIGS. 4A and 4B, the design is such that the sealing lip is again connected to the sealing protrusion 3*a*, for example by being molded or injection-molded onto it. In this case, however, the sealing lip 7 is connected in terms of its extension in the assembly direction M to the sealing protrusion 3*a* in question. In addition, it can be seen that the sealing protrusion 3*a* is designed as at least one plug-in pin in all cases. The plug-in pin or the sealing protrusion 3*a* and the receptacle 5 or the free region 6 remaining at this point can be equipped with corresponding bevels 8, 9, which are also already observed in the exemplary embodiment according to FIG. 1. The bevel 8 may be provided on the sealing protrusion 3*a*, whereas the corresponding counter-bevel 9 is part of the receptacle 5.

In the exemplary embodiment according to FIGS. 4A and 4B, the sealing lip 7 is now not only connected in the assembly direction M to the sealing protrusion 3*a* or the plug-in pin implemented at this point, but also to the bevel 8 formed at this point. In this way, the sealing lip 7, in the assembled state, rests against the counter-bevel 9 of the receptacle 5 as shown in the illustration in FIG. 4B and, together with the corresponding contact between the bevel 8 and counter-bevel 9, ensures that any gap remaining at this point is closed.

Figure 3:
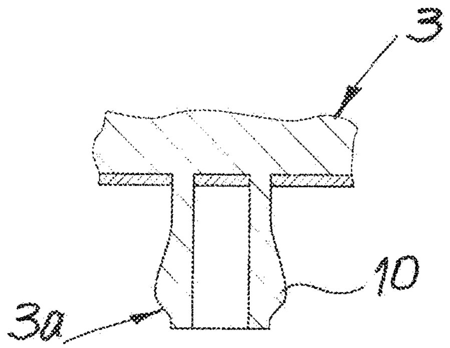
FIG. 3 shows a third exemplary embodiment and FIGS. 4A and 4B show a fourth exemplary embodiment.

In the variant according to FIG. 3, two or more spaced-apart plug-in pins are provided at this point as a sealing protrusion 3*a*. The relevant plug-in pin can additionally be equipped with a sealing formation 10. This sealing formation 10 may be a region in which an elastomeric or rubber-like plastics material is additionally injection-molded onto the plug-in pin or the sealing protrusion 3*a*, which is deformed when the sealing protrusion 3*a* is united with the receptacle 5 and closes a gap remaining between the relevant sealing protrusion 3*a* or the plug-in pin provided at this point, on the one hand, and the receptacle 5, on the other hand.

LIST OF REFERENCE SIGNS

1 Electric switch
1*a* Plug connection
2 Component carrier
3 Cover
3*a* Plug-in pin or sealing protrusion
2, 3 Housing
4 Conductor track
4*a* Connecting pieces
5 Receptacle
6 Free region
7 Sealing lip
8 Bevel
9 Counter-bevel
10 Sealing formation
M Assembly direction

The invention claimed is:

1. A motor vehicle electrical component assembly comprising:
- an electrical component,
- a component carrier having a cover and defining a receptacle, the component carrier including conductor tracks for making electrical contact with the electrical component, wherein the electrical component is received in the receptacle in the component carrier without a potting compound, and
- a sealing protrusion which seals the receptacle and is provided on the cover of the component carrier, and, when the cover is united with the component carrier in an assembly direction, the cover sealingly engages by way of the sealing protrusion protruding into the receptacle,
- wherein the sealing protrusion comprises at least one plug-in pin.

2. The assembly according to claim 1, wherein the sealing protrusion has at least one sealing lip.

3. The assembly according to claim 2, wherein the sealing lip is molded onto the sealing protrusion.

4. The assembly according to claim 3, wherein the sealing lip is injection-molded onto the sealing protrusion.

5. The assembly according to claim 2, wherein the sealing lip is connected to the sealing protrusion transversely to the assembly direction and/or in the assembly direction.

6. The assembly according to claim 1, wherein the at least one plug-in pin comprises two or more spaced-apart plug-in pins.

7. The assembly according to claim 1, wherein the sealing protrusion has a sealing formation.

8. The assembly according to claim 1, wherein the sealing protrusion and the receptacle are equipped with corresponding bevels that slide along each other for sealing.

9. The assembly according to claim 1, wherein the cover and the component carrier are plastics material molded parts.

10. The assembly according to claim 9, wherein the cover and the component carrier are plastics material injection-molded parts.

11. The assembly according to claim 1, wherein the at least one plug-in pin includes a flexible region that acts as a sealing formation.

12. The assembly according to claim 1, wherein the receptable includes a free region adjacent to the electrical component that receives the sealing protrusion.

* * * * *